United States Patent
Hill et al.

(10) Patent No.: US 11,841,621 B2
(45) Date of Patent: Dec. 12, 2023

(54) MOIRÉ SCATTEROMETRY OVERLAY

(71) Applicant: KLA Corporation, Milpitas, CA (US)

(72) Inventors: Andrew V. Hill, Berkeley, CA (US); Vladimir Levinski, Nazareth Ilit (IL); Amnon Manassen, Haifa (IL); Yuri Paskover, Milpitas, CA (US)

(73) Assignee: KLA Corporation CA, Milpitas, CA (US)

( * ) Notice: Subject to any disclaimer, the term of this patent is extended or adjusted under 35 U.S.C. 154(b) by 0 days.

(21) Appl. No.: 17/562,844

(22) Filed: Dec. 27, 2021

(65) Prior Publication Data

US 2023/0133640 A1    May 4, 2023

Related U.S. Application Data

(60) Provisional application No. 63/273,322, filed on Oct. 29, 2021.

(51) Int. Cl.
| | | |
|---|---|---|
| *G03F 7/00* | (2006.01) | |
| *G01B 11/14* | (2006.01) | |
| *G01B 11/27* | (2006.01) | |

(52) U.S. Cl.
CPC .......... *G03F 7/70633* (2013.01); *G01B 11/14* (2013.01); *G01B 11/272* (2013.01)

(58) Field of Classification Search
CPC ....... G01B 11/14; G01B 11/27; G01B 11/272; G03F 7/70633
See application file for complete search history.

(56) References Cited

U.S. PATENT DOCUMENTS

| | | | |
|---|---|---|---|
| 7,403,293 B2 | 7/2008 | Pellemans et al. | |
| 7,528,941 B2* | 5/2009 | Kandel | G03F 7/70633 356/600 |
| 7,652,776 B2 | 1/2010 | Shyu et al. | |
| 9,841,688 B2 | 12/2017 | Ko et al. | |
| 9,846,359 B1* | 12/2017 | Oh | G03F 7/70683 |
| 10,197,389 B2* | 2/2019 | Levinski | G03F 7/70633 |

(Continued)

OTHER PUBLICATIONS

Korean Intellectual Property Office, International Search Report and Written Opinion for International Application No. PCT/US2022/047072, dated Feb. 14, 2023, 8 pages.

*Primary Examiner* — Gordon J Stock, Jr.
(74) *Attorney, Agent, or Firm* — Suiter Swantz pc llo

(57) ABSTRACT

An overlay metrology system may scan a sample including inverted Moiré structure pairs along a scan direction, include an illumination sub-system to illuminate first and second Moiré structures of one of an inverted Moiré structure pair with common mutually coherent illumination beam distributions, and include an objective lens to capture at least $+/-1$ diffraction orders from sample, where a first pupil plane includes overlapping distributions of the collected light with an interference pattern associated with relative wavefront tilt. The system may also include a diffractive element in the first pupil plane, where one diffraction order associated with the first Moiré structure and one diffraction order associated with the second Moiré structure overlap at a common overlap region in a field plane, and a collection field stop located in the field plane to pass light in the common overlap region and block remaining light and remove the relative wavefront tilt.

39 Claims, 10 Drawing Sheets

(56) References Cited

U.S. PATENT DOCUMENTS

| | | |
|---|---|---|
| 10,401,738 B2 * | 9/2019 | Hill ..................... G03F 7/70633 |
| 11,073,768 B2 | 7/2021 | Hill et al. |
| 11,118,903 B2 * | 9/2021 | Hill .......................... G02F 1/33 |
| 11,164,307 B1 | 11/2021 | Feler et al. |
| 11,300,524 B1 * | 4/2022 | Hill ..................... G03F 7/70616 |
| 11,346,657 B2 * | 5/2022 | Manassen ............ G03F 7/70633 |
| 11,531,275 B1 * | 12/2022 | Hill ..................... G03F 7/70491 |
| 2017/0268869 A1 | 9/2017 | Levinski et al. |
| 2021/0072650 A1 | 3/2021 | Feler et al. |
| 2021/0333218 A1 | 10/2021 | Feler |
| 2021/0364279 A1 | 11/2021 | Manassen et al. |

* cited by examiner

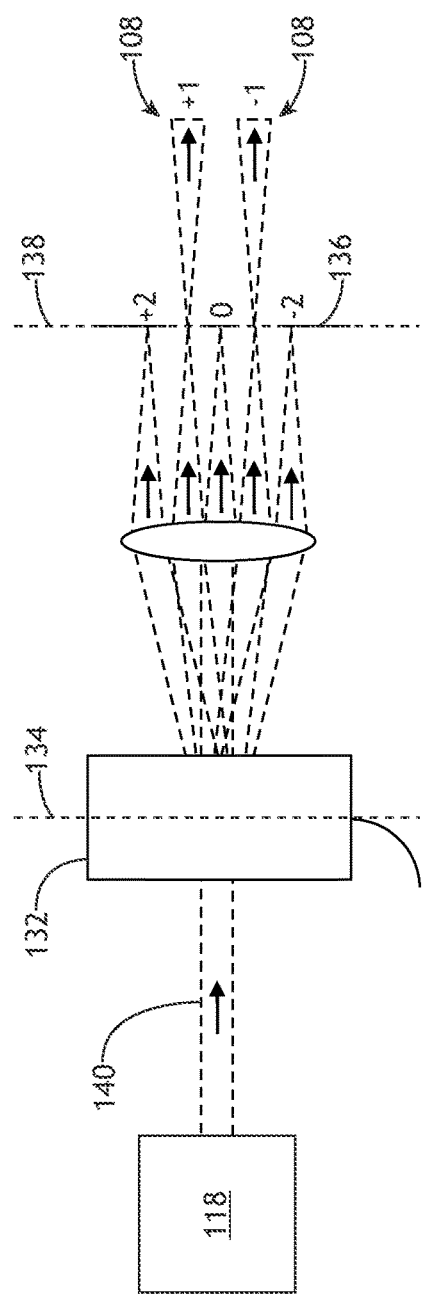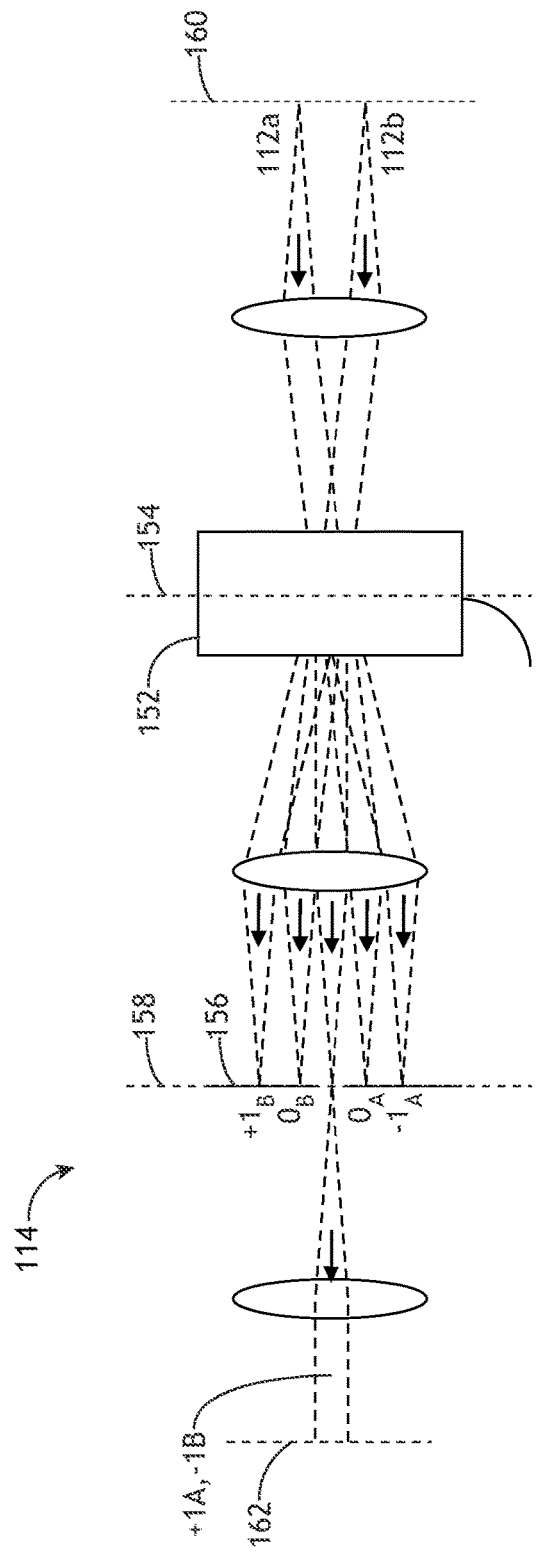

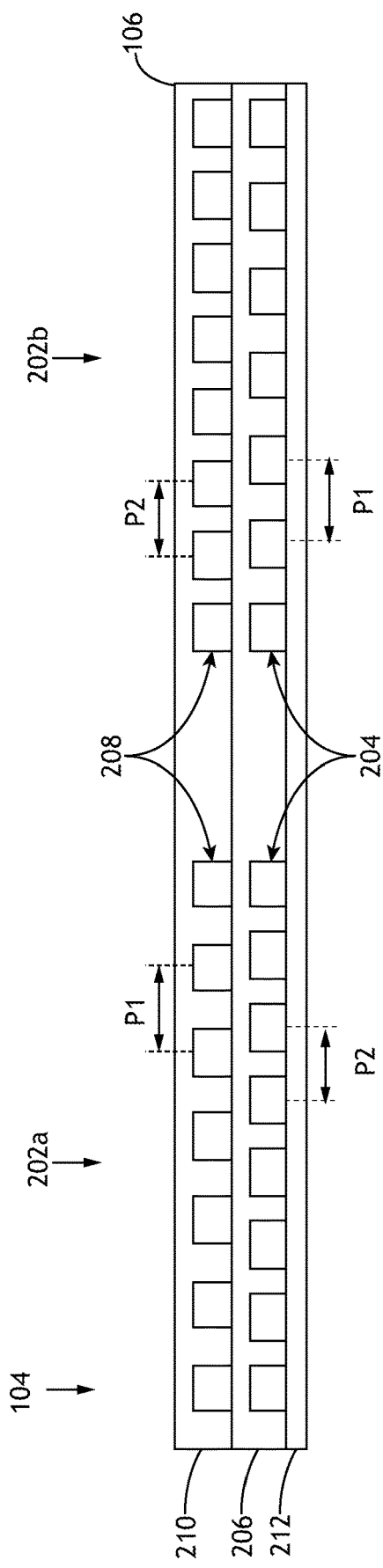

MOIRÉ SCATTEROMETRY OVERLAY

CROSS-REFERENCE TO RELATED APPLICATION

The present application claims the benefit under 35 U.S.C. § 119(e) of U.S. Provisional Application Ser. No. 63/273,322, filed Oct. 29, 2021 entitled MOIRÉ SCATTEROMETRY OVERLAY, naming Andrew V. Hill, Vladimir Levinsky, Amnon Manassesn, and Yuri Paskover as inventors, which is incorporated herein by reference in the entirety.

TECHNICAL FIELD

The present disclosure relates generally to scatterometry overlay metrology and, more particularly, to scatterometry overlay metrology with Moiré targets.

BACKGROUND

Overlay metrology generally refers to measurements of the relative alignment of layers on a sample such as, but not limited to, semiconductor devices. An overlay measurement, or a measurement of overlay error, typically refers to a measurement of the misalignment of fabricated features two or more sample layers. In a general sense, proper alignment of fabricated features on multiple sample layers is necessary for proper functioning of the device.

Demands to decrease feature size and increase feature density are resulting in correspondingly increased demand for accurate and efficient overlay metrology. One approach to increasing the efficiency and throughput of an overlay metrology tool is based on scanning overlay metrology in which metrology data is generated on a sample as it is in motion. In this way, time delays associated with settling of the translation stage prior to a measurement may be eliminated. Metrology systems typically generate metrology data associated with a sample by measuring or otherwise inspecting dedicated overlay targets distributed across the sample. However, existing scanning overlay metrology techniques are unsuitable for use on advanced overlay target designs. Therefore, it is desirable to provide systems and methods for curing the above deficiencies.

SUMMARY

An overlay metrology system is disclosed in accordance with one or more illustrative embodiments of the present disclosure. In one illustrative embodiment, the system includes a translation stage to scan a sample including a Moiré overlay target along a scan direction, where the Moiré overlay target includes one or more inverted Moiré structure pairs, and where a particular one of the one or more inverted Moiré structure pairs includes a first Moiré structure and a second Moiré structure, each including an upper grating on a first layer of the sample and a lower grating on a second layer of the sample that overlaps the upper grating. In another illustrative embodiment, the upper grating of the first Moiré structure and the lower grating of the second Moiré structure have a first pitch along a particular measurement direction, where the lower grating of the first Moiré structure and the upper grating of the second Moiré structure have a second pitch different than the first pitch. In another illustrative embodiment, the system includes an illumination sub-system to illuminate the first and second Moiré structures of one of the one or more inverted Moiré structure pairs with common mutually coherent illumination beam distributions. In another illustrative embodiment, the system includes an objective lens to capture at least +/−1 diffraction orders from the upper and lower gratings of the illuminated one of the one or more inverted Moiré structure pairs as collected light, where a first pupil plane includes overlapping pupil-plane distributions of the collected light from the first and second Moiré structures with an interference pattern associated with a relative wavefront tilt between the collected light from the first and second Moiré structures. In another illustrative embodiment, the system includes a diffractive element located in the first pupil plane, where one diffraction order of the collected light associated with the first Moiré structure and one diffraction order of the collected light associated with the second Moiré structure overlap at a common overlap region in a field plane. In another illustrative embodiment, the system includes a collection field stop located in the field plane to pass light in the common overlap region and block remaining light. In another illustrative embodiment, the system includes one or more detectors located at a second pupil plane, where the second pupil plane includes the overlapping pupil-plane distributions of the collected light from the first and second Moiré structures without the interference pattern associated with the relative wavefront tilt between the collected light from the first and second Moiré structures. In another illustrative embodiment, the system includes a controller to determine an overlay measurement between the first sample layer and the second sample layer along the particular measurement direction based on data from the one or more detectors.

An overlay metrology method is disclosed in accordance with one or more illustrative embodiments of the present disclosure. In one illustrative embodiment, the method includes translating a sample including a Moiré overlay target along a scan direction, where the Moiré overlay target includes one or more inverted Moiré structure pairs, and where a particular one of the one or more inverted Moiré structure pairs includes a first Moiré structure and a second Moiré structure, each including an upper grating on a first layer of the sample and a lower grating on a second layer of the sample that overlaps the upper grating. In another illustrative embodiment, the upper grating of the first Moiré structure and the lower grating of the second Moiré structure have a first pitch along a particular measurement direction, where the lower grating of the first Moiré structure and the upper grating of the second Moiré structure have a second pitch different than the first pitch. In another illustrative embodiment, the method includes illuminating the first and second Moiré structures of one of the one or more inverted Moiré structure pairs with common mutually coherent illumination beam distributions. In another illustrative embodiment, the method includes capturing at least +/−1 diffraction orders from the upper and lower gratings of the illuminated one of the one or more inverted Moiré structure pairs as collected light, where a first pupil plane includes overlapping pupil-plane distributions of the collected light from the first and second Moiré structures with an interference pattern associated with a relative wavefront tilt between the collected light from the first and second Moiré structures. In another illustrative embodiment, the method includes diffracting, with a diffractive element located in the first pupil plane, the collected light from the first and second Moiré structures, where one diffraction order of the collected light associated with the first Moiré structure and one diffraction order of the collected light associated with the second Moiré structure overlap at a common overlap region in a field plane. In another illustrative embodiment, the method includes selectively passing light in a common overlap region and blocking remaining light. In another illustrative embodiment, the method includes detecting at least a portion of a distribution of light at a second pupil plane with one or more detectors, where the second pupil plane includes the overlapping pupil-plane distributions of the collected light from the first and second Moiré structures without the interference pattern associated with the relative wavefront tilt between the collected light from the first and second Moiré structures. In another illustrative embodiment, the method includes determining an overlay measurement between the first sample layer and the second sample layer along the particular measurement direction based on data from the one or more detectors.

An overlay metrology system is disclosed in accordance with one or more illustrative embodiments of the present disclosure. In one illustrative embodiment, the system includes an illumination sub-system to illuminate an inverted Moiré structure pair on a sample, where the inverted Moiré structure pair includes a first Moiré structure and a second Moiré structure, each including an upper grating on a first layer of the sample and a lower grating on a second layer of the sample that overlaps the upper grating. In another illustrative embodiment, the upper grating of the first Moiré structure and the lower grating of the second Moiré structure have a first pitch along a particular measurement direction, where the lower grating of the first Moiré structure and the upper grating of the second Moiré structure have a second pitch along the particular measurement direction different than the first pitch. In another illustrative embodiment, the illumination sub-system illuminates the first and second Moiré structures with common mutually coherent illumination beam distributions. In another illustrative embodiment, the system includes an objective lens to capture at least +/−1 diffraction orders from the upper and lower gratings of the illuminated one of the one or more inverted Moiré structure pairs as collected light, where a first pupil plane includes overlapping pupil-plane distributions of the collected light from the first and second Moiré structures with an interference pattern associated with a relative wavefront tilt between the collected light from the first and second Moiré structures. In another illustrative embodiment, the system includes a diffractive element located in the first pupil plane, where one diffraction order of the collected light associated with the first Moiré structure and one diffraction order of the collected light associated with the second Moiré structure overlap at a common overlap region in a field plane. In another illustrative embodiment, the system includes a collection field stop located in the field plane to pass light in the common overlap region and block remaining light. In another illustrative embodiment, the system includes one or more detectors to capture the one diffraction order of the collected light associated with the first Moiré structure and one diffraction order of the collected light associated with the second Moiré structure passed by the collection field stop.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1C is a schematic view of optical components suitable for generating two illumination beams through diffraction, in accordance with one or more embodiments of the present disclosure.

FIG. 1D is a schematic view of the wavefront-tilt mitigation optics, in accordance with one or more embodiments of the present disclosure.

FIG. 2A is a side view of an inverted Moiré structure pair, in accordance with one or more embodiments of the present disclosure.

DETAILED DESCRIPTION

Figure 1A:
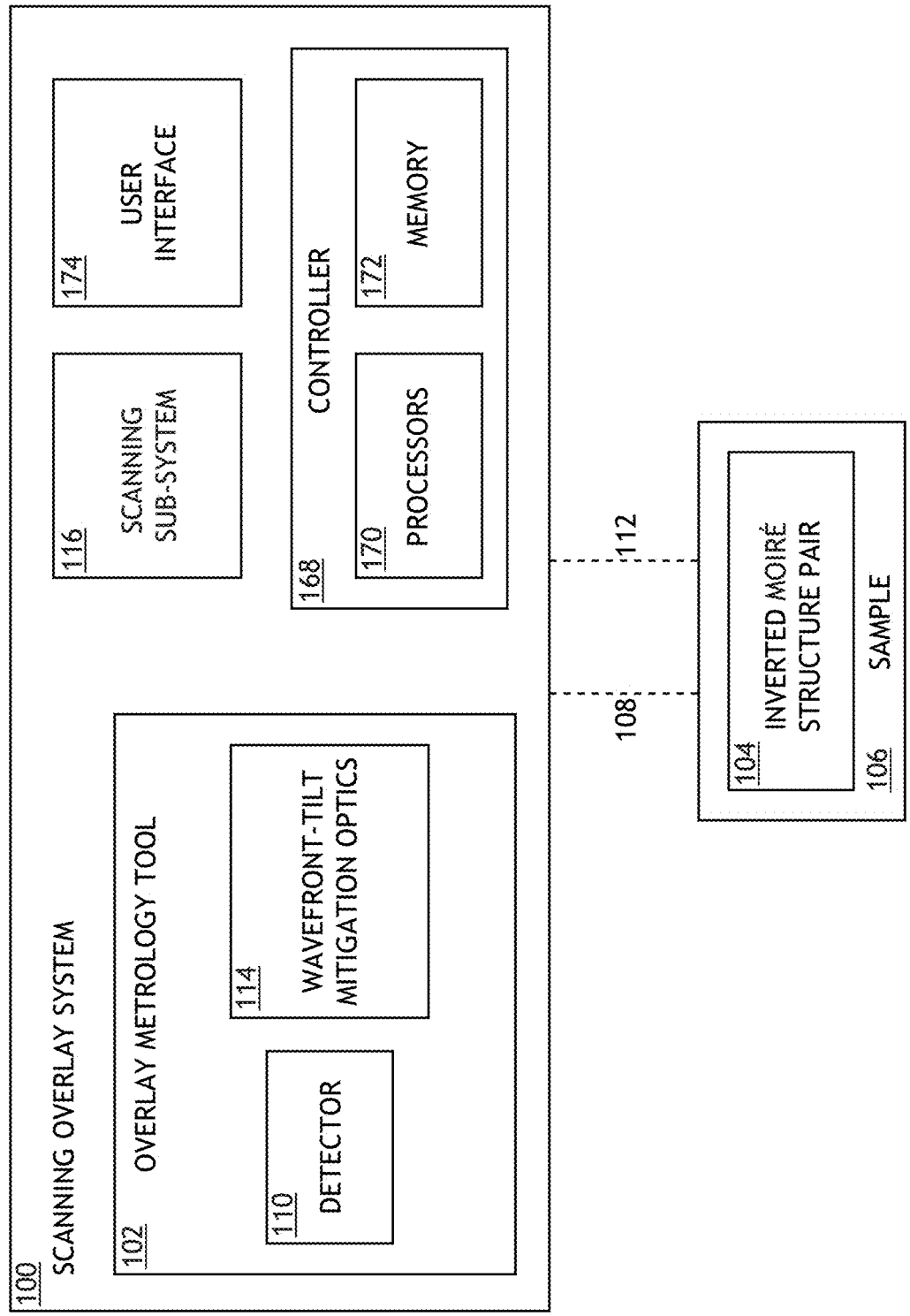
FIG. 1A is a block diagram view of a scanning overlay system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for scatterometry overlay metrology using Moiré targets. For the purposes of the present disclosure, the term scatterometry metrology is used to broadly encompass the terms scatterometry-based metrology and diffraction-based metrology in which a sample having periodic features on one or more sample layers is illuminated with an illumination beam having a limited angular extent, and one or more distinct diffraction orders are collected for measurement. Further, the term scanning metrology is used to describe metrology measurements generated when samples are in motion. In a general sense, scanning metrology may be implemented by scanning a sample along a measurement path (e.g., a swath, or the like) such that regions of interest on the sample (e.g., metrology targets, device areas, or the like) are translated through a measurement field of view of a metrology system. Further, the process may be repeated for any number of measurement paths or repeated measurements of particular measurement paths to provide any desired number of measurements of the sample.

It is contemplated herein that scatterometry overlay metrology is commonly performed using a scatterometry overlay target including one or more grating-over-grating structures formed as diffraction gratings with common pitches (e.g., periods) and directions of periodicity on two sample layers in an overlapping region. In particular, a scatterometry overlay target may commonly include multiple cells, where each cell has a grating-over-grating structure with a different intended overlay offset (e.g., a programmed overlay offset). In this configuration, an overlay measurement of actual overlay errors between the associated sample layers may be determined based on analysis of the multiple cells. Such targets may be characterized through analysis of pupil-plane images and/or field-plane images of the grating-over-grating structures and may further be characterized in static (e.g., Move-and-Measure) or scanning measurement modes. Various techniques for determining an overlay measurement with such scatterometry overlay targets are generally described in U.S. patent application Ser. No. 17/068,328 filed on Oct. 12, 2020, which is incorporated herein by reference in their entirety.

It is further contemplated herein that overlay targets including grating-over-grating structures in which the overlapping gratings have different pitches (herein referred to as Moiré structures) may take advantage of the Moiré effect in which a Moiré diffraction pattern is generated. This Moiré diffraction pattern may be related to overlay by a gain factor associated with a difference between the pitches of the constituent gratings. As a result, such overlay targets may provide highly sensitive overlay measurements. Overlay metrology using overlay targets with Moiré grating structures is generally described in U.S. patent application Ser. No. 16/935,117 filed on Jul. 21, 2020 and U.S. Patent Publication No. 2021/0072650 published on Mar. 11, 2021, both of which are incorporated herein by reference in their entirety.

However, overlay targets including Moiré structure targets are commonly characterized using static measurement modes. In particular, because the pitches of the constituent gratings of a Moiré structure are different, the offsets between individual lines of the constituent gratings vary across a cell. As a result, the apparent overlay (or apparent overlay error) may vary based on the particular location of an illumination beam used to characterize the target. Existing scanning scatterometry overlay techniques developed for traditional grating-over-grating structures with equal pitches may thus be unsuitable for characterization of Moiré targets.

Embodiments of the present disclosure are directed to scanning scatterometry techniques suitable for characterization of Moiré targets (e.g., targets including at least one Moiré structure). In particular, some embodiments are directed to characterizing an overlay target including at least one pair of cells including Moiré structures with inverted grating pitch configurations (e.g., a pair of inverted Moiré structures or an inverted Moiré structure pair). For example, a first Moiré structure in a pair may include upper-layer grating features having a first pitch and lower-layer grating features having a second pitch, whereas a second Moiré structure in the pair may include upper-layer grating structures with the second pitch and lower-layer grating features with the first pitch.

In some embodiments, a pair of inverted Moiré structures is simultaneously illuminated with two spatially and temporally mutually coherent illumination beams, and at least first-order diffraction from both the first-layer and second-layer gratings is collected by an objective lens. Further, various measurement conditions such as, but not limited to, the wavelength of the illumination beams, incidence angles of the illumination beams, or the pitches of constituent gratings in the inverted Moiré structures may be selected to provide that first-order diffraction from gratings with both the first and second pitches is collected and at least partially non-overlapping in a pupil plane.

It is noted that diffraction from gratings in the inverted Moiré structures with equal pitch will overlap in the pupil plane. For example, diffraction from the first-layer grating of the first Moiré structure in a pair and diffraction from the second-layer grating of the second Moiré structure in the pair will overlap, and so on. Since the illumination beam's incident on the first and second Moiré structures are mutually coherent, the overlapping diffraction orders will interfere. However, the spatial separation of the first and second Moiré structures will result in a relative phase tilt in the pupil plane associated with the wavefronts of the first and second Moiré structures that may be present in the associated interference patterns.

In some embodiments, a diffractive element is positioned in a collection pupil plane to diffract the wavefronts from the first and second Moiré structures of a pair to a common field region at a collection field plane to remove the relative phase tilts between the associated wavefronts. For example, the pupil-plane diffractive element may provide that a +1 diffraction order associated with collected light from one Moiré structure in the inverted pair and a −1 diffraction order associated with collected light from the other Moiré structure in the inverted pair may overlap in the common field region in the collection field plane. Further, a field stop at the collection field plane may selectively pass light in a common field region in which the relative phase tilts have been corrected and block remaining light to isolate the light in this common field region.

In some embodiments, a detector is placed at a pupil plane (e.g., a plane conjugate to the pupil plane including the diffraction element). In this way, the detector may generate a pupil image based on light from the common field region in which the relative phase tilts between the wavefronts from the first and second Moiré structures have been corrected. As a result, the distribution of light at the plane of the detector may be similar to the distribution at the plane of the diffractive element, but without the effects of the relative wavefront tilt associated with the spatial separation of the two inverted Moiré structures. For example, the distribution of light at the plane of the detector may include at least first-order diffraction from the gratings with the first and second pitches in the inverted pair of Moiré structures, where diffraction from gratings with equal periods overlap, but diffraction from gratings with different periods is at least partially non-overlapping.

It is contemplated herein that the phase and intensity of the diffraction orders at the plane of the detector may vary based on the particular locations of the illumination beams due to the varying offsets between individual grating elements. However, in the measurement configurations disclosed herein, the phases of the wavefronts from the first and second Moiré structures will vary synchronously as the sample is scanned along the scan direction. In this way, although the phases and intensities of the collected overlapping diffraction orders may vary as the sample is scanned, differences between the phase and/or intensity between various diffraction orders may remain constant as the sample is scanned.

Various techniques may be utilized to determine overlay measurements based on one or more pupil plane images from the detector. In some embodiments, overlay measurements are generated by comparing relative intensities in opposing lobes from one grating pitch to the relative intensities in the opposing lobes from the other grating pitch. In some embodiments, the position of one illumination beam is varied along a direction of periodicity for one of the Moiré structures in an inverted Moiré structure pair relative to the other Moiré structure during a scan. In this way, the phase of interference between wavefronts of the first and second Moiré structures may modulate during a scan, and an overlay measurement may be generated based on measurements of this phase modulation. For example, multiple pupil images may be generated during a scan to capture the interference between the wavefronts of the first and second Moiré structures at different relative positions of the two illumination beams to capture the phase modulation for the determination of overlay.

Referring now to FIGS. 1A-5, systems and methods for scanning overlay metrology using inverted pairs of Moiré structures are described in greater detail, in accordance with one or more embodiments of the present disclosure.

FIG. 1A is a block diagram view of a scanning overlay system 100, in accordance with one or more embodiments of the present disclosure.

In some embodiments, the scanning overlay system 100 includes an overlay metrology tool 102 to illuminate a pair of inverted Moiré structures (e.g., an inverted Moiré structure pair 104) on a sample 106 with mutually-coherent illumination beams 108 (or distributions of illumination beams 108) and one or more detectors 110 in a collection pupil to capture light (e.g., collected light 112) associated with diffraction from the inverted Moiré structure pair 104. The overlay metrology tool 102 may further include one or more optical elements to remove a relative phase tilt between collected light 112 from the constituent Moiré structures of the inverted Moiré structure pair 104, which are referred to herein as wavefront-tilt mitigation optics 114.

In some embodiments, the overlay metrology tool 102 includes a scanning sub-system 116 to scan the sample 106 with respect to a measurement field of the scanning Moiré overlay target 214 during an overlay measurement. For example, the scanning sub-system 116 may include a translation stage to position and orient the sample 106 within a focal volume of the objective lens 142, where the translation stage may include any number of actuators (e.g., linear, rotational, and/or angular tip/tilt actuators). By way of another example, the scanning sub-system 116 may include one or more beam-scanning optics (e.g., piezo-electric mirrors, micro-electro-mechanical system (MEMS) mirrors, rotatable mirrors, galvanometers, acousto-optic deflectors (AODs), or the like) to scan the illumination beams 108 with respect to the sample 106). In a general sense, the scanning sub-system 116 may thus actuate any combination of the sample 106 or the illumination beams 108 to provide a scan.

FIG. 2A is a side view of an inverted Moiré structure pair 104, in accordance with one or more embodiments of the present disclosure. In some embodiments, an inverted Moiré structure pair 104 includes a first Moiré structure 202a and a second Moiré structure 202b, each formed as a lower grating 204 on a first sample layer 206 and an upper grating 208 on a second sample layer 210. The first sample layer 206 and the second sample layer 210 may be disposed on a substrate 212 with any number of additional sample layers above, below, or between them. Further, the upper grating 208 of the first Moiré structure 202a and the lower grating 204 of the second Moiré structure 202b may have a first pitch P1, whereas the lower grating 204 of the first Moiré structure 202a and the upper grating 208 of the second Moiré structure 202b may have a second pitch P2 that is different from the first pitch P1. In FIG. 2A, the first pitch P1 is greater than the second pitch P2, though it is to be understood that this configuration is illustrative and should not be interpreted as limiting.

Figure 2B:
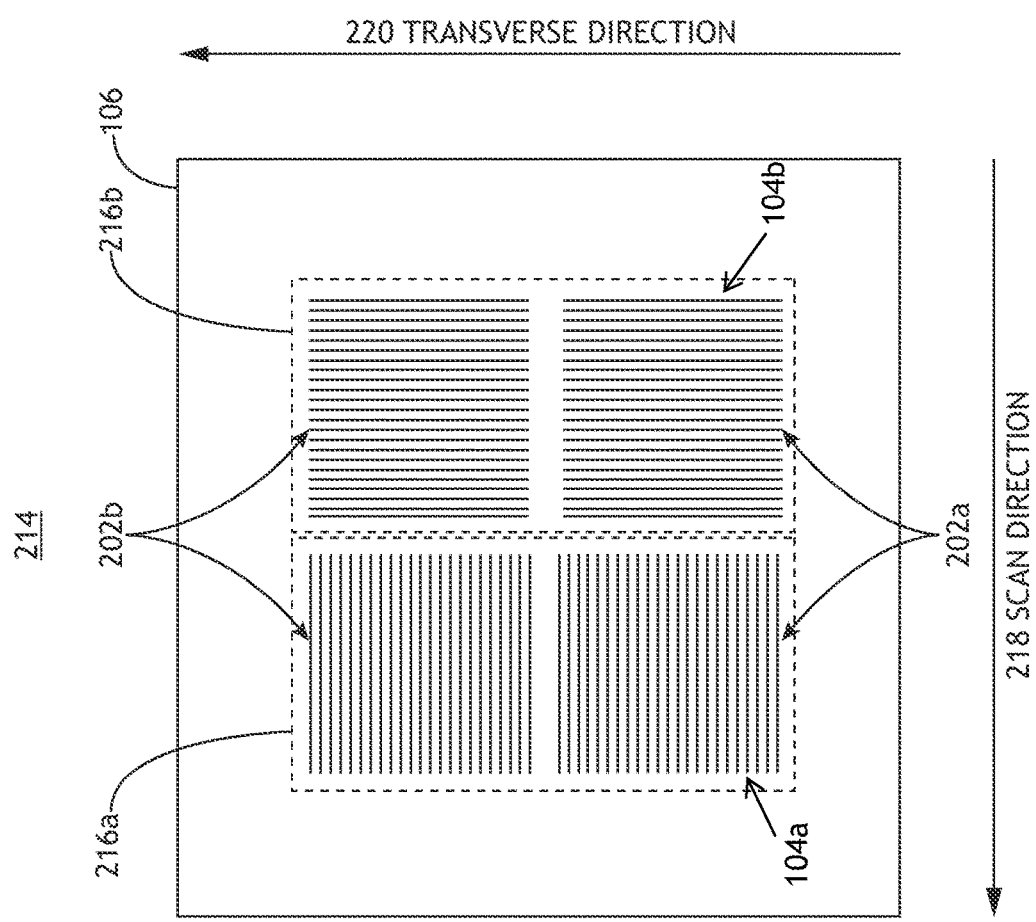
FIG. 2B is a top view of a scanning Moiré overlay target including two pairs of inverted Moiré structures having periodicities along two orthogonal directions, in accordance with one or more embodiments of the present disclosure.

FIG. 2B is a top view of a scanning Moiré overlay target 214 including two pairs of inverted Moiré structures 104 having periodicities along two orthogonal directions, in accordance with one or more embodiments of the present disclosure. In some embodiments, a scanning Moiré overlay target 214 includes one or more measurement groups 216 distributed along a scan direction 218 (e.g., a direction along which a sample 106 is scanned during a scanning measurement), where a measurement group includes inverted Moiré structure pairs 104 distributed along a transverse direction 220 orthogonal to the scan direction 218. For example, the scanning Moiré overlay target 214 in FIG. 2B includes a first measurement group 216a with a first inverted Moiré structure pair 104a with periodicity along a first measurement direction and a second measurement group 216b with a second inverted Moiré structure pair 104b with periodicity along a second measurement direction (e.g., orthogonal to the first measurement direction). In this way, the scanning Moiré overlay target 214 may facilitate overlay measurements along any direction within a plane of the sample 106. It is recognized herein that a scanning Moiré overlay target 214 including measurement groups 216 distributed along the scan direction 218 and pairs of inverted Moiré structures 104 distributed along the transverse direction 220 within the measurement groups 216 may be well-suited for scanning metrology. For example, time-varying measurement errors may be consistent for the pairs of cells in any measurement group 216 as the sample 106 is scanned along the scan direction 218. Metrology target designs suitable for scanning metrology are generally described in U.S. Pat. No. 11,073,768 issued on Jul. 27, 2021.

Figure 1B:
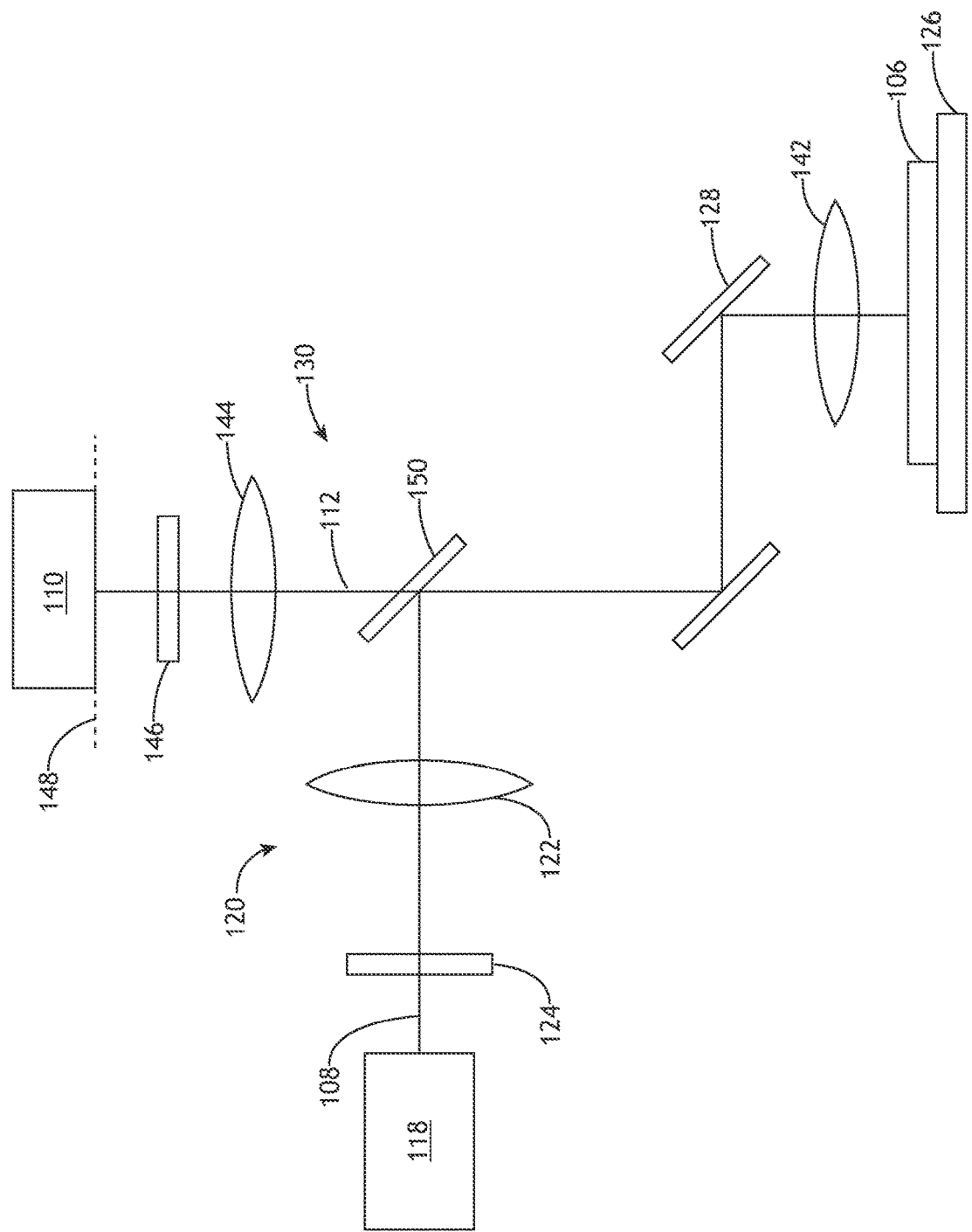
FIG. 1B is a schematic view of the overlay metrology tool, in accordance with one or more embodiments of the present disclosure.

FIG. 1B is a schematic view illustrating the overlay metrology tool 102, in accordance with one or more embodiments of the present disclosure. In some embodiments, the overlay metrology tool 102 includes an illumination source 118 configured to generate at least two illumination beams 108 (e.g., illumination lobes, or the like) for illumination of an inverted Moiré structure pair 104. The illumination from the illumination source 118 may include one or more selected wavelengths of light including, but not limited to, ultraviolet (UV) radiation, visible radiation, or infrared (IR) radiation.

The illumination source 118 may include any type of illumination source suitable for providing at least one illumination beam 108. In some embodiments, the illumination source 118 is a laser source. For example, the illumination source 118 may include, but is not limited to, one or more narrowband laser sources, a broadband laser source, a supercontinuum laser source, a white light laser source, or the like. In this regard, the illumination source 118 may provide an illumination beam 108 having high coherence (e.g., high spatial coherence and/or temporal coherence). In some embodiments, the illumination source 118 includes a laser-sustained plasma (LSP) source. For example, the illumination source 118 may include, but is not limited to, an LSP lamp, an LSP bulb, or an LSP chamber suitable for containing one or more elements that, when excited by a laser source into a plasma state, may emit broadband illumination. In some embodiments, the illumination source 118 includes a lamp source. For example, the illumination source 118 may include, but is not limited to, an arc lamp, a discharge lamp, an electrode-less lamp, or the like. In this regard, the illumination source 118 may provide an illumination beam 108 having low coherence (e.g., low spatial coherence and/or temporal coherence).

In some embodiments, the overlay metrology tool 102 directs the illumination beams 108 to the inverted Moiré structure pair 104 via an illumination sub-system 120. The illumination sub-system 120 may include one or more optical components suitable for modifying and/or conditioning the illumination beam 108 as well as directing the illumination beam 108 to the inverted Moiré structure pair 104. In some embodiments, the illumination beams 108 underfill the constituent Moiré structures of the inverted Moiré structure pair 104.

In some embodiments, the illumination sub-system 120 includes one or more illumination sub-system lenses 122 (e.g., to collimate the illumination beam 108, to relay pupil and/or field planes, or the like). In some embodiments, the illumination sub-system 120 includes one or more illumination sub-system optics 124 to shape or otherwise control the illumination beam 108. For example, the illumination sub-system optics 124 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, as illustrated in FIG. 1B, the overlay metrology tool 102 (e.g., the scanning sub-system 116 of the overlay metrology tool 102) may include both a translation stage 126 and one or more beam-scanning optics 128. In this way, the overlay metrology tool 102 may independently adjust positions of one or more illumination beams 108 on the sample 106 with the beam-scanning optics 128 as the sample 106 is translated by the translation stage 126. Further, beam-scanning optics 128 may be located at any suitable location in the overlay metrology tool 102 including, but not limited to, a pupil plane common to both the illumination sub-system 120 and a collection sub-system 130. Pupil-plane beam scanning is generally described in U.S. patent application Ser. No. 17/142,783 filed on Jan. 6, 2021, which is incorporated herein by reference in its entirety.

Figure 3:
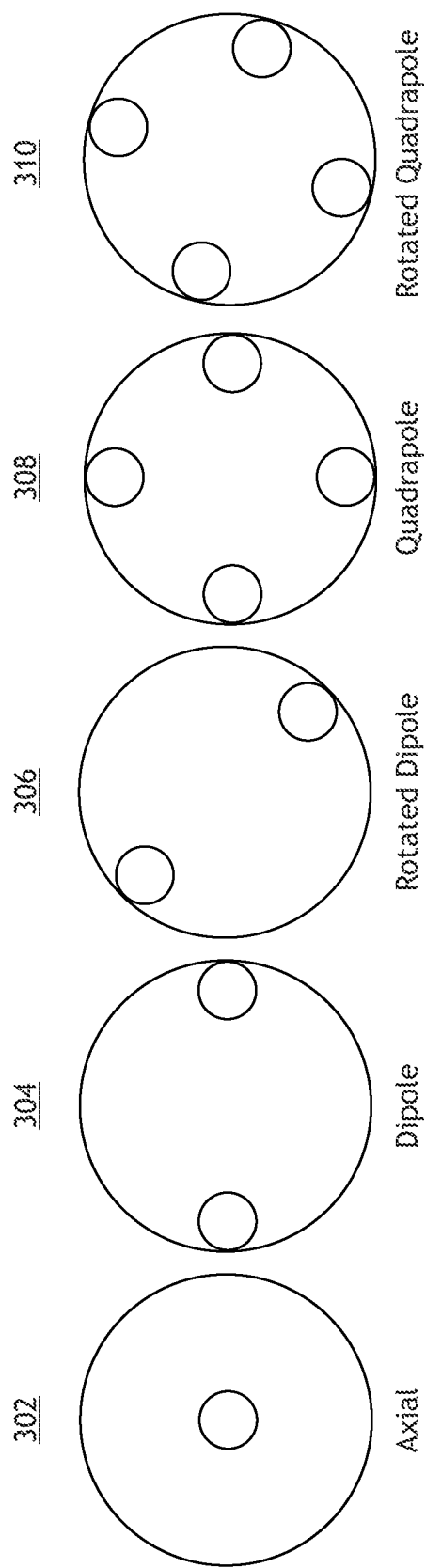
FIG. 3 includes conceptual views of non-limiting example illumination distributions of illumination beams in an illumination pupil, in accordance with one or more embodiments of the present disclosure.

The illumination sub-system 120 may provide any number of illumination beams 108 in any distribution. As an illustration, FIG. 3 includes conceptual views of non-limiting example illumination distributions of illumination beams 108 in an illumination pupil, in accordance with one or more embodiments of the present disclosure. For example, each Moiré structure 202 in an inverted Moiré structure pair 104 may be illuminated with a common mutually-coherent distribution of illumination beams 108 such as, but not limited to, those illustrated in FIG. 3. In particular, FIG. 3 illustrates a first distribution 302 with single illumination beam 108 at a normal incidence angle, a second distribution 304 with two opposing illumination beams 108 in a dipole arrangement, a third distribution 306 with two opposing illumination beams 108 in a rotated dipole arrangement, a fourth distribution 308 with four illumination beams 108 in a quadrupole arrangement, and a fifth distribution 310 with four illumination beams 108 in a rotated quadrupole arrangement.

In some embodiments, the overlay metrology tool 102 illuminates each Moiré structure 202 in an inverted Moiré structure pair 104 with mutually coherent illumination beams 108 having the same illumination parameters (e.g., the same illumination and field plane distributions). In this way, the collected light 112 from the Moiré structures 202 may also be the same. Further, in some embodiments, a size of each illumination beam 108 is smaller than the associated Moiré structure 202 such that the Moiré structures 202 are underfilled.

The illumination sub-system 120 may provide illumination beams 108 using any technique known in the art. In some embodiments, the illumination sub-system 120 includes one or more apertures at an illumination pupil plane to divide illumination from the illumination source 118 into two or more illumination beams 108. In some embodiments, the illumination sub-system 120 generates illumination beams 108 by providing light in two or more optical fibers, where light output from each optical fiber provided at or directed to an illumination pupil to provide an illumination beam 108. In some embodiments, the illumination source 118 generates illumination beams 108 by diffracting illumination from the illumination source 118 into two or more diffraction orders, where at least one of the diffraction orders forms at least one illumination beam 108. Efficient generation of multiple illumination beams through controlled diffraction is generally described in U.S. Patent Publication No. US2020/0124408 titled Efficient Illumination Shaping for Scatterometry Overlay, which is incorporated herein by reference in its entirety.

FIG. 1C is a schematic view of optical components suitable for generating two illumination beams 108 through diffraction, in accordance with one or more embodiments of the present disclosure. In particular, FIG. 1C illustrates a configuration of an illumination sub-system 120 including a diffractive element 132 at a pupil plane 134 and an illumination field stop 136 at a field plane 138. In this configuration, the diffractive element 132 may diffract illumination 140 from the illumination source 118 (e.g., the illumination beams 108) and the illumination field stop 136 may include one or more apertures designed to selectively pass two diffraction orders and block remaining diffraction orders. For example, FIG. 1C illustrates a configuration in which the illumination field stop 136 selectively passes +/−1 diffraction orders of the illumination 140. Further, the spacing of the +/−1 diffraction orders and the corresponding one or more apertures may be designed to correspond to the size and spacing of an inverted Moiré structure pair 104 such that each diffraction order passed by the illumination field stop 136 may correspond to an illumination beam 108 to be directed to a Moiré structure 202.

The diffractive element 132 may include any static or tunable diffraction element suitable for generating at least two diffraction orders of the illumination 140 such as, but not limited to, one or more diffraction gratings or one or more prisms. In some embodiments, the diffractive element 132 includes an acousto-optic deflector (AOD) to provide tunable diffraction. Further, in some embodiments, the diffractive element 132 includes an AOD in a Raman-Nath configuration such that the +1 and −1 diffraction orders are generated with equal efficiency. Accordingly, an RF drive frequency for the diffractive element 132 may determine diffraction angles for a given wavelength of illumination 140 and an RF drive amplitude may determine the diffraction efficiency into the +/−1 diffraction orders.

It is to be understood, however, that FIG. 1C and the associated description are provided solely for illustrative purposes and should not be interpreted as limiting. Rather, the illumination sub-system 120 may include any optical components arranged to provide mutually coherent illumination of Moiré structures 202 in an inverted Moiré structure pair 104.

Referring again to FIG. 1B, in some embodiments, the overlay metrology tool 102 includes an objective lens 142 to focus the illumination beams 108 onto an inverted Moiré structure pair 104. The objective lens 142 may further capture light emanating from the sample 106 (e.g., collected light 112).

In some embodiments, the overlay metrology tool 102 includes a collection sub-system 130 to direct at least a portion of the collected light 112 from the objective lens 142 to one or more detectors 110. The collection sub-system 130 may include one or more optical elements suitable for modifying and/or conditioning the collected light 112 from the sample 106. In some embodiments, the collection sub-system 130 includes one or more collection sub-system lenses 144 (e.g., to collimate the illumination beam 108, to relay pupil and/or field planes, or the like), which may include, but is not required to include, the objective lens 142. In some embodiments, the collection sub-system 130 includes one or more collection sub-system optics 146 to shape or otherwise control the collected light 112. For example, the collection sub-system optics 146 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In some embodiments, the overlay metrology tool 102 includes at least one detector 110 at a detection plane 148 to capture collected light 112 associated with diffraction of light from the inverted Moiré structure pair 104, where the detection plane 148 corresponds to a collection pupil plane. In this way, diffraction orders from an inverted Moiré structure pair 104 may be imaged or otherwise observed in the detection plane 148.

The overlay metrology tool 102 may generally include any number or type of detectors 110 suitable for capturing light from the sample 106 indicative of overlay. In some embodiments, a detector 110 may include a two-dimensional pixel array (e.g., a focal plane array) such as, but not limited to, a charge-coupled device (CCD) or a complementary metal-oxide semiconductor (CMOS) device. In this way, a detector 110 may capture a pupil-plane image or a portion thereof. Further, such a detector 110 may provide a capture time and/or a refresh rate sufficient to capture one or more pupil images during a scan. In some embodiments, a detector 110 includes a single-pixel sensor such as, but not limited to, a photodiode. For example, the overlay metrology tool 102 may include two or more single-pixel detectors 110 in a pupil plane to capture diffracted light at particular locations in the pupil plane and thus capture light at particular diffraction angles.

The illumination sub-system 120 and the collection sub-system 130 of the overlay metrology tool 102 may be oriented in a wide range of configurations suitable for illuminating the sample 106 with the illumination beam 108 and collecting light emanating from the sample 106 in response to the incident illumination beam 108. For example, as illustrated in FIG. 1B, the overlay metrology tool 102 may include a beamsplitter 150 oriented such that a common objective lens 142 may simultaneously direct the illumination beam 108 to the sample 106 and collect light from the sample 106. By way of another example, the illumination sub-system 120 and the collection sub-system 130 may contain non-overlapping optical paths such that the illumination beams 108 are directed to the sample 106 outside of the objective lens 142.

Further, the overlay metrology tool 102 may be configurable to generate measurements based on any number of recipes defining measurement parameters. For example, a recipe of an overlay metrology tool 102 may include, but is not limited to, parameters associated with an incidence illumination beam 108 (e.g., wavelength, angle of incidence, polarization, spot size, focal depth, or the like), parameters associated with a portion of collected light 112 that reaches a detector 110 (e.g., wavelength, collection angle, polarization, imaging depth, or the like), or parameters associated with a detector 110 (e.g., integration time, gain, or the like).

Figure 4A:
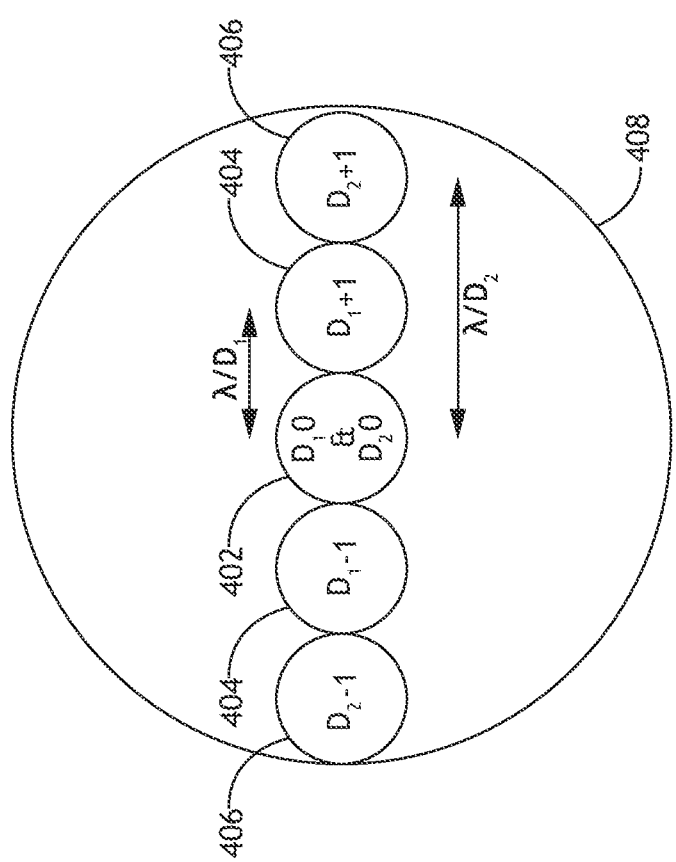
FIG. 4A is a conceptual view of a non-overlapping pupil plane distribution of collected light from a Moiré structure based on illumination at a normal incidence angle, in accordance with one or more embodiments of the present disclosure.
Figure 4B:
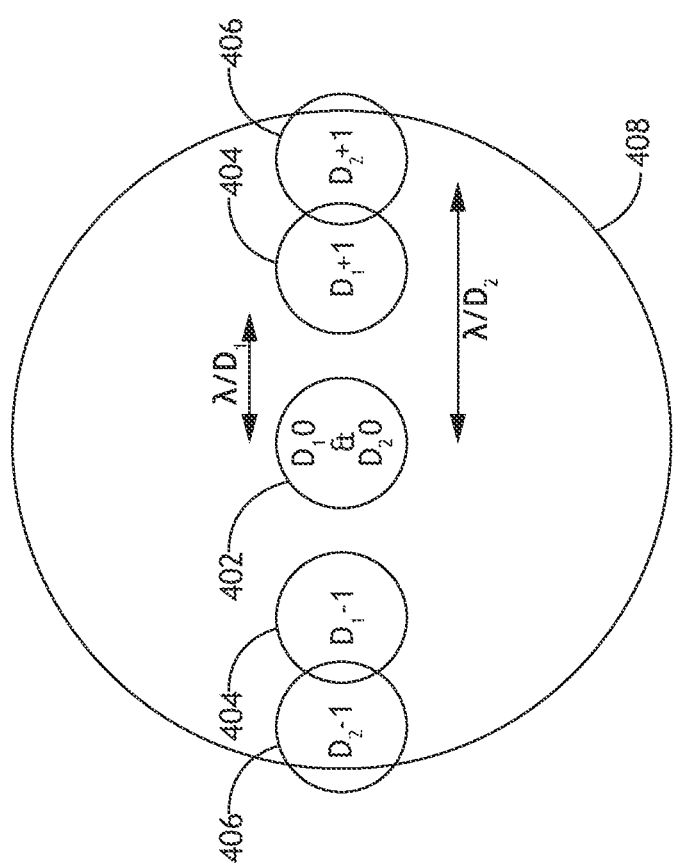
FIG. 4B is a conceptual view of a partially-overlapping pupil plane distribution of collected light from a Moiré structure based on illumination at a normal incidence angle, in accordance with one or more embodiments of the present disclosure.

Referring now generally to FIGS. 4A-4B, the use of wavefront-tilt mitigation optics 114 to generate a wavefront-tilt-corrected pupil-plane distribution from an inverted Moiré structure pair 104 at a common detection plane 148 is described in greater detail, in accordance with one or more embodiments of the present disclosure.

It is contemplated herein that a pupil-plane distribution of collected light 112 from each Moiré structure 202 of an inverted Moiré structure pair 104 may be substantially the same when illuminated with identical illumination conditions (e.g., illumination wavelength, angle, polarization, and the like), with the primary difference being a relative phase tilt associated with the spatial separation on the sample 106. In some embodiments, a measurement recipe of the overlay metrology tool 102 is configured to provide that the first-order diffraction associated with the first and second pitches (e.g., P1 and P2 of the inverted Moiré structure pair 104 illustrated in FIG. 2A) are collected and are at least partially non-overlapping in the pupil plane.

As an illustration, FIGS. 4A and 4B include exemplary pupil-plane distributions. FIG. 4A is a conceptual view of a non-overlapping pupil plane distribution of collected light 112 from a Moiré structure 202 based on illumination at a normal incidence angle, in accordance with one or more embodiments of the present disclosure. FIG. 4B is a conceptual view of a partially-overlapping pupil plane distribution of collected light 112 from a Moiré structure 202 based on illumination at a normal incidence angle, in accordance with one or more embodiments of the present disclosure. For example, the pupil plane distributions in FIGS. 4A and 4B may be generated based on illumination with the first distribution 302 of FIG. 3.

In particular, FIGS. 4A and 4B illustrate zero-order diffraction 402 labeled as "$D_1$ 0 & $D_2$ 0," first-order diffraction 404 from gratings having the first pitch P1 (e.g., the upper grating 208 of the first Moiré structure 202a and the lower grating 204 of the second Moiré structure 202b in FIG. 2A) labeled as "$D_1+1$" and "$D_1-1$," and first-order diffraction 406 from gratings having the second pitch P2 (e.g., the lower grating 204 of the first Moiré structure 202a and the upper grating 208 of the second Moiré structure 202b in FIG. 2A)

labeled as "D$_2$+1" and "D$_2$−1." Further, FIG. 4A illustrates a configuration in which the first-order diffraction 404 from gratings having the first pitch P1 and the first-order diffraction 406 from gratings having the second pitch P2 are fully collected (e.g., not truncated) and fully non-overlapping. In contrast, FIG. 4B illustrates a configuration in which the first-order diffraction 406 from gratings having the second pitch P2 is partially truncated (e.g., includes angles outside a boundary 408 of the collection pupil) and further partially overlap the first-order diffraction 404 from gratings having the first pitch P1.

Although not explicitly illustrated in FIGS. 4A and 4B, diffraction orders from gratings with a common pitch emanating from different Moiré structures 202 of an inverted Moiré structure pair 104 may overlap, but may generate an interference pattern due to the differences in wavefront tilt associated with the spatial separation on the sample 106. In some embodiments, the wavefront-tilt mitigation optics 114 remove or otherwise mitigate interference patterns associated with the relative wavefront tilt differences.

The wavefront-tilt mitigation optics 114 may generally include any combination of optical components suitable for removing or otherwise mitigating the interference patterns associated with the relative wavefront tilt differences.

FIG. 1D is a schematic view of the wavefront-tilt mitigation optics 114, in accordance with one or more embodiments of the present disclosure. In some embodiments, the wavefront-tilt mitigation optics 114 include a diffractive element 152 in a pupil plane 154 and a collection field stop 156 at a field plane 158. For example, the pupil plane 154 at which the diffractive element 152 is located may correspond to the pupil-plane distribution illustrated in FIG. 4A, FIG. 4B, or a similar distribution in which an interference pattern associated with wavefront tilt is present.

In this configuration, the diffractive element 152 may diffract collected light 112 from each Moiré structure 202 of an inverted Moiré structure pair 104. For example, FIG. 1D illustrates collected light 112a associated with the first Moiré structure 202a emanating from a field plane 160 (or the sample 106), which is diffracted into multiple diffraction orders labeled+1$_A$, 0$_A$, and −1$_A$. The collected light 112b associated with the second Moiré structure 202b emanating from the field plane 160 (or the sample 106) is similarly diffracted into multiple diffraction orders labeled+1$_B$, 0$_B$, and −1$_B$. Although not explicitly shown for purposes of clarity, it is noted that the collected light 112 from each Moiré structure 202 (e.g., collected light 112a and collected light 112b), along with each associated diffraction order (e.g., +1$_A$, 0$_A$, −1$_A$, +1$_B$, 0$_B$, and −1$_B$, and so on) contains the full distribution of light diffracted by the Moiré structures 202 that is collected by the objective lens 142.

It is contemplated herein that the diffractive element 152 may be configured to provide that a positive diffraction order of collected light 112 from one Moiré structure 202 overlaps with a corresponding negative diffraction order of collected light 112 from the other Moiré structure 202 at a common overlap location at the field plane 158 and further contemplated herein that such a configuration may remove or otherwise compensate for the wavefront tilt associated with the spatial separation of the Moiré structures 202. In some embodiments, the collection field stop 156 at the field plane 158 includes one or more apertures configured to selectively pass light at the common overlap location and block remaining light. For example, FIG. 1D illustrates a configuration in which the +1$_A$ and −1$_B$ diffraction orders overlap at a common overlap location corresponding to an optical axis (e.g., a center of the field plane 158) and are selectively passed by the collection field stop 156.

As a result, the pupil-plane distribution at a detector 110 located at a subsequent pupil plane 162 (e.g., the detection plane 148) may be substantially the same as at the pupil plane 154 including the diffractive element 152 except that the interference pattern associated with the wavefront tilt is removed.

The diffractive element 152 may include any static or tunable diffraction element suitable for generating at least two diffraction orders of the collected light 112 such as, but not limited to, one or more diffraction gratings or one or more prisms. In some embodiments, the diffractive element 152 includes an AOD to provide tunable diffraction. Further, in some embodiments, the diffractive element 132 includes an AOD in a Raman-Nath configuration such that the +1 and −1 diffraction orders are generated with equal efficiency. Accordingly, an RF drive frequency for the diffractive element 132 may determine diffraction angles for a given wavelength of illumination 140 and an RF drive amplitude may determine the diffraction efficiency into the +/−1 diffraction orders.

Figure 1E:
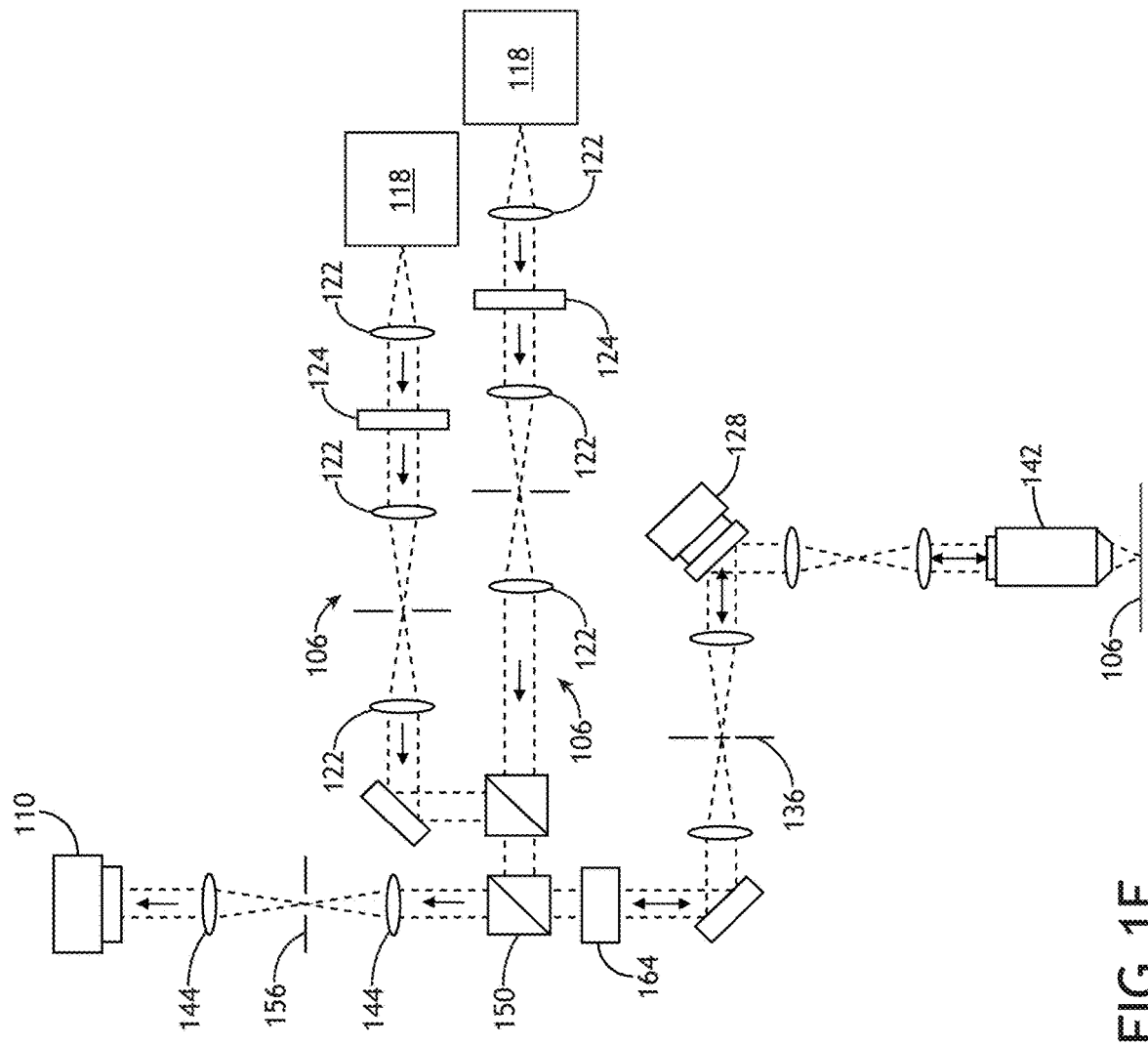
FIG. 1E is a schematic view of the overlay metrology tool in which the wavefront-tilt mitigation optics are located on an optical path common to the illumination sub-system and the collection sub-system, in accordance with one or more embodiments of the present disclosure.

Referring now to FIG. 1E, in some embodiments, the wavefront-tilt mitigation optics 114 are located on an optical path common to the illumination sub-system 120 and the collection sub-system 130 and are configured to simultaneously generate illumination beams 108 for illuminating an inverted Moiré structure pair 104 and for mitigating wavefront tilt from the associated collected light 112.

For example, FIG. 1E is a schematic view of the overlay metrology tool 102 in which the wavefront-tilt mitigation optics 114 are located on an optical path common to the illumination sub-system 120 and the collection sub-system 130, in accordance with one or more embodiments of the present disclosure. In particular, FIG. 1E illustrates a configuration in which the wavefront-tilt mitigation optics 114 includes a diffraction grating 164 formed as an AOD in a Raman-Nath configuration positioned to simultaneously operate as the diffractive element 132 illustrated in FIG. 1C and the diffractive element 152 illustrated in FIG. 1D. For example, the diffraction grating 164 may receive and diffract illumination 140 from the illumination source 118 (e.g., the illumination beams 108). The illumination field stop 136 may then pass +/−1 diffraction orders of the illumination 140 as illustrated in FIG. 1C, which may be directed to an inverted Moiré structure pair 104 on a sample 106 through the objective lens 142. The collected light 112 from the objective lens 142 may then propagate back through the illumination field stop 136 to the diffraction grating 164 and be diffracted as illustrated in FIG. 1D. The collection field stop 156 may then pass overlapping light associated with one diffraction order from each Moiré structure 202 to a detector 110 at the subsequent pupil plane 162 as further illustrated in FIG. 1D.

It is contemplated herein that the use of a common diffraction grating 164 for both the generation of mutually coherent illumination beams 108 to be directed to Moiré structures 202 of an inverted Moiré structure pair 104 and to mitigate wavefront tilt in the associated collected light 112 (e.g., as illustrated in FIG. 1E) may facilitate straightforward alignment of the associated components and may provide a robust overlay metrology tool 102.

Referring again generally to FIGS. 1A-1E, various additional components of the scanning overlay system 100 are described in greater detail, in accordance with one or more embodiments of the present disclosure.

As described previously herein, the overlay metrology tool 102 may be configurable according to various metrology recipes including parameters associated with illumination, collection, and or detection. It is contemplated herein that the overlay metrology tool 102 may be configured to implement such metrology recipes using any of a variety of techniques within the spirit and scope of the present disclosure.

In some embodiments, the overlay metrology tool 102 includes two or more channels in the illumination sub-system 120 and/or the collection sub-system 130. For example, each channel may provide a different set of illumination and/or collection conditions. The overlay metrology tool 102 may then select any combination of one or more channels at a time for a particular measurement using shutters or any suitable switching technique.

As an illustration, FIG. 1E illustrates two illumination channels 166. For example, the illumination channels 166 may provide illumination beams 108 with different (e.g., orthogonal) polarizations, which may be suitable for, but not limited to, adjusting the polarization of the illumination beams 108 based on direction of periodicity of the Moiré structures 202.

In some embodiments, the scanning overlay system 100 includes a controller 168 communicatively coupled to the overlay metrology tool 102 and/or any components therein. In some embodiments, the controller 168 includes one or more processors 170. For example, the one or more processors 170 may be configured to execute a set of program instructions maintained in a memory device 172, or memory. The one or more processors 170 of a controller 168 may include any processing element known in the art. In this sense, the one or more processors 170 may include any microprocessor-type device configured to execute algorithms and/or instructions.

The one or more processors 170 of a controller 168 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 170 may include any device configured to execute algorithms and/or instructions (e.g., program instructions stored in memory). In some embodiments, the one or more processors 170 may be embodied as a desktop computer, mainframe computer system, workstation, image computer, parallel processor, networked computer, or any other computer system configured to execute a program configured to operate or operate in conjunction with the scanning overlay system 100, as described throughout the present disclosure. Moreover, different subsystems of the scanning overlay system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 168 may include one or more controllers housed in a common housing or within multiple housings. In this way, any controller or combination of controllers may be separately packaged as a module suitable for integration into scanning overlay system 100.

The memory device 172 may include any storage medium known in the art suitable for storing program instructions executable by the associated one or more processors 170. For example, the memory device 172 may include a non-transitory memory medium. By way of another example, the memory device 172 may include, but is not limited to, a read-only memory (ROM), a random-access memory (RAM), a magnetic or optical memory device (e.g., disk), a magnetic tape, a solid-state drive and the like. It is further noted that the memory device 172 may be housed in a common controller housing with the one or more processors 170. In some embodiments, the memory device 172 may be located remotely with respect to the physical location of the one or more processors 170 and the controller 168. For instance, the one or more processors 170 of the controller 168 may access a remote memory (e.g., server), accessible through a network (e.g., internet, intranet and the like).

The controller 168 may direct (e.g., through control signals) or receive data from the overlay metrology tool 102 or any components therein. The controller 168 may further be configured to perform any of the various process steps described throughout the present disclosure.

In some embodiments, the scanning overlay system 100 includes a user interface 174 communicatively coupled to the controller 168. In some embodiments, the user interface 174 may include, but is not limited to, one or more desktops, laptops, tablets, and the like. In some embodiments, the user interface 174 includes a display used to display data of the scanning overlay system 100 to a user. The display of the user interface 174 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 174 is suitable for implementation in the present disclosure. In some embodiments, a user may input selections and/or instructions responsive to data displayed to the user via a user input device of the user interface 174.

Figure 5:
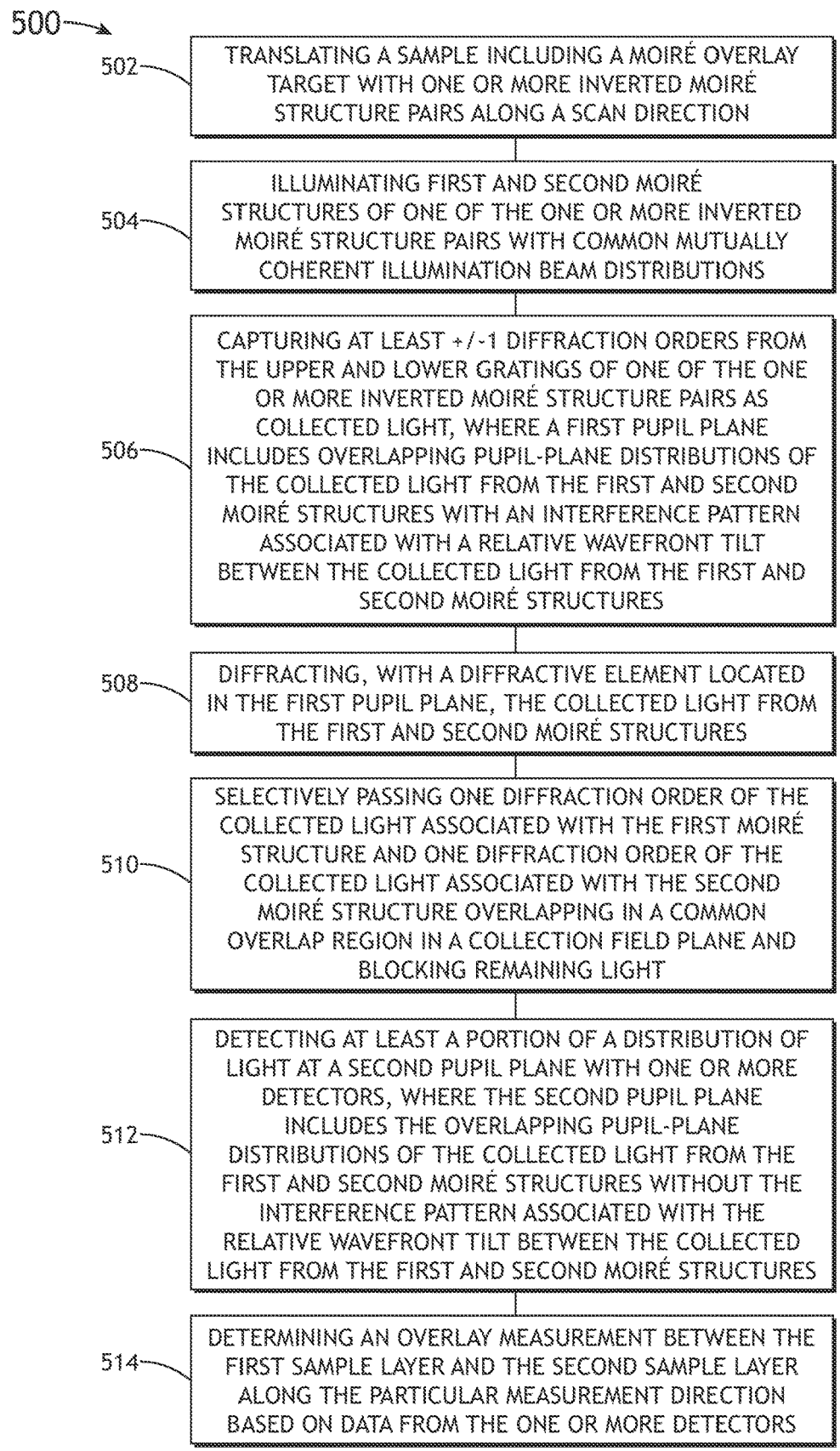
FIG. 5 is a flow diagram illustrating steps performed in a method for scanning overlay metrology, in accordance with one or more embodiments of the present disclosure.

FIG. 5 is a flow diagram illustrating steps performed in a method 500 for scanning overlay metrology, in accordance with one or more embodiments of the present disclosure. Applicant notes that the embodiments and enabling technologies described previously herein in the context of the scanning overlay system 100 should be interpreted to extend to method 500. It is further noted, however, that the method 500 is not limited to the architecture of the scanning overlay system 100.

In some embodiments, the method 500 includes a step 502 of translating a sample including a Moiré overlay target with one or more inverted Moiré structure pairs along a scan direction. For example, a Moiré overlay target may include an inverted Moiré structure pair 104 as illustrated in FIGS. 2A and 2B.

In some embodiments, the method 500 includes a step 504 of illuminating the first and second Moiré structures of one of the one or more inverted Moiré structure pairs with common mutually coherent illumination beam distributions. In some embodiments, the method 500 includes a step 506 of capturing at least +/−1 diffraction orders from the upper and lower gratings of one of the one or more inverted Moiré structure pairs as collected light, where a first pupil plane includes overlapping pupil-plane distributions of the collected light from the first and second Moiré structures with an interference pattern associated with a relative wavefront tilt between the collected light from the first and second Moiré structures.

For example, each of the common mutually coherent illumination beam distributions may correspond to, but are not limited to, one of the distributions illustrated in FIG. 3. Further, the distributions may be varied or otherwise selected based on the direction of periodicity of a particular inverted Moiré structure pair 104 being illuminated. For example, the illumination beam distributions may be selected, perhaps along with illumination or collection parameters, to facilitate the collection of the at least +/−1 diffraction orders from the upper and lower gratings of the illuminated first and second Moiré structures having the first and second pitches.

In some embodiments, the method 500 includes a step 508 of diffracting, with a diffractive element located in the first pupil plane, the collected light from the first and second Moiré structures. In some embodiments, the method 500 includes a step 510 of selectively passing one diffraction order of the collected light associated with the first Moiré structure and one diffraction order of the collected light associated with the second Moiré structure overlapping in a common overlap region in a collection field plane and blocking remaining light. For example, a lens or other optical element may generate a field-plane distribution of light emanating from the first pupil plane, which may include multiple diffracted orders of field-plane distributions of the collected light from each of the first and second Moiré structures (e.g., as illustrated in FIG. 1D). Further, the spacing between the diffraction orders (e.g., governed by a periodicity of the diffractive element in the first pupil plane, the wavelengths of the collected light, or the like) may be selected to provide that one diffraction order of the collected light associated with the first Moiré structure and one diffraction order of the collected light associated with the second Moiré structure overlap in a common overlap region in the collection field plane. Accordingly, this overlapping light in the common overlap region may be selectively passed by a field stop located at the collection field plane having an aperture sized and positioned to correspond to the common overlap region.

In some embodiments, the method 500 includes a step 512 of detecting at least a portion of a distribution of light at a second pupil plane with one or more detectors, where the second pupil plane includes the overlapping pupil-plane distributions of the collected light from the first and second Moiré structures without the interference pattern associated with the relative wavefront tilt between the collected light from the first and second Moiré structures. The one or more detectors may include any suitable number or type of detectors such as, but not limited to, a two-dimensional sensor array or two or more single-pixel sensors.

In some embodiments, the method 500 includes a step 514 of determining an overlay measurement between the first sample layer and the second sample layer along the particular measurement direction based on data from the one or more detectors.

It is contemplated herein that the step 514 of determining the overlay measurement may be implemented in a variety of ways within the spirit and scope of the present disclosure.

In some embodiments, the overlay is determined based on intensity asymmetries in the second pupil plane. The intensities of the diffraction orders in the second pupil plane will depend on the interference of the overlapping wavefronts from the first and second Moiré structures. For example, there may be constructive or destructive interference in each of the first diffraction orders (e.g., the +/−1 diffraction orders from the gratings with the first and second pitches in the first and second Moiré structures), where the phases of the wavefronts will depend on the positions of illumination beams on the first and second Moiré structures. It is contemplated herein that a lateral shift between the first and second sample layers induced by overlay errors may induce phase shifts of opposing diffraction orders with respect to each other. For example, overlay errors may induce phase shifts between +1 diffraction and −1 diffraction from the gratings with the first pitch as well as phase shifts between +1 diffraction and −1 diffraction from the gratings with the second pitch. Accordingly, overlay error may be determined by comparing relative intensities of opposing diffraction orders from gratings with the first pitch with relative intensities of opposing diffraction orders from gratings with the second pitch.

In some embodiments, the overlay is determined based on phase asymmetries in the second pupil plane generated by translating the illumination distributions on the first and second Moiré structures with respect to each other along the direction of periodicity. It is contemplated herein that translating the illumination distributions in a common pattern (e.g., in tandem) on the first and second Moiré structures may result in simultaneous modulations of interference associated with overlapping light in each diffraction order in the second pupil plane. However, translating the illumination distributions on the first and second Moiré structures with respect to each other along the direction of periodicity may induce a modulation of the interference patterns. This interference modulation enables the extraction of the relative spatial phases of the upper and lower gratings of the first and second Moiré structures and thus extraction of the overlay error between the first and second sample layers.

For example, multiple measurements (e.g., pupil images or portions thereof) may be generated for multiple relative positions of the illumination distributions of the first and second Moiré structures (e.g., for multiple induced phase asymmetries) to sample this induced interference modulation. The overlay may then be determined based on the multiple measurements.

The relative positions of the illumination distributions on the first and second Moiré structures may be varied using any technique known in the art. Further, different techniques may be used to provide relative variations along different directions. For example, as illustrated in FIG. 2B, a scanning Moiré overlay target 214 may include one inverted Moiré structure pair 104 with periodicity along the scan direction and one inverted Moiré structure pair 104 with periodicity along the transverse direction.

For example, the relative positions of illumination distributions on the first and second Moiré structures along the transverse direction may be varied during a scan through techniques such as, but not limited to, optical zooming, wavelength modulation, or modulation of an RF drive frequency for an AOD used to generate one or more illumination beams (e.g., as illustrated in FIG. 1C). By way of another example, the relative positions of illumination distributions on the first and second Moiré structures along the scan direction may be varied during a scan by rotating a modulation direction of a diffraction grating used to generate one or more illumination beams. For instance, an AOD used to generate one or more illumination beams may include transducers along multiple axes. Acoustic waves from such multiple transducers may interfere in the acoustic medium of the AOD to generate a standing grating. Further, modulating the relative drive amplitudes of the transducers may rotate the grating axis.

Additionally, in some embodiments, the illumination distributions of the first and second Moiré structures are modulated simultaneously in a common pattern (e.g., in tandem) during a particular data capture by the one or more detectors to mitigate noise (e.g., target noise, or the like) in an overlay measurement. Simultaneous modulation of the illumination distributions of the first and second Moiré structures may be implemented using any technique known in the art. As an example, in the context of the scanning overlay system 100, the beam-scanning optics 128 may provide simultaneous modulation of the illumination distributions of the first and second Moiré structures.

Referring now generally to FIGS. 1A through 5, it is to be understood that FIGS. 1A-5 are provided solely for illustrative purposes and should not be interpreted to be limiting. For example, it is contemplated herein that the scanning overlay system 100 and/or method 500 may be modified to provide overlay measurements from an inverted Moiré structure pair 104 in a static (e.g., Move-and-Measure) mode of operation. In this way, references to a scanning system or to measurements of a sample in motion are merely illustrative. By way of another example, it is contemplated herein that the scanning overlay system 100 and/or method 500 may be modified to provide field-plane measurements of an inverted Moiré structure pair 104. For example, the one or more detectors 110 may be located at a field plane (e.g., the field plane 160 or a conjugate thereof). Further, overlay measurements may be generated at least in part based on this field-plane data.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
    a translation stage configured to scan a sample including a Moiré overlay target along a scan direction, wherein the Moiré overlay target includes one or more inverted Moiré structure pairs, wherein a particular one of the one or more inverted Moiré structure pairs includes a first Moiré structure and a second Moiré structure, each including an upper grating on a first layer of the sample and a lower grating on a second layer of the sample that overlaps the upper grating, wherein the upper grating of the first Moiré structure and the lower grating of the second Moiré structure have a first pitch along a particular measurement direction, wherein the lower grating of the first Moiré structure and the upper grating of the second Moiré structure have a second pitch different than the first pitch;
    an illumination sub-system configured to illuminate the first and second Moiré structures of one of the one or more inverted Moiré structure pairs with common mutually coherent illumination beam distributions;
    an objective lens configured to capture at least +/−1 diffraction orders from the upper and lower gratings of the illuminated one of the one or more inverted Moiré structure pairs as collected light, wherein a first pupil plane includes overlapping pupil-plane distributions of the collected light from the first and second Moiré structures with an interference pattern associated with a relative wavefront tilt between the collected light from the first and second Moiré structures;
    a diffractive element located in the first pupil plane, wherein one diffraction order of the collected light associated with the first Moiré structure and one diffraction order of the collected light associated with the second Moiré structure overlap at a common overlap region in a field plane;
    a collection field stop located in the field plane configured to pass light in the common overlap region and block remaining light;
    one or more detectors located at a second pupil plane, wherein the second pupil plane includes the overlapping pupil-plane distributions of the collected light from the first and second Moiré structures without the interference pattern associated with the relative wavefront tilt between the collected light from the first and second Moiré structures; and
    a controller communicatively coupled with the one or more detectors, the controller including one or more processors configured to execute program instructions causing the one or more processors to determine an overlay measurement between the first sample layer and the second sample layer along the particular measurement direction based on data from the one or more detectors.

2. The overlay metrology system of claim 1, wherein the +1 diffraction orders from the upper gratings and the lower gratings are at least partially non-overlapping in the first pupil plane and the second pupil plane, wherein the −1 diffraction orders from the upper gratings and the lower gratings are at least partially non-overlapping in the first pupil plane and the second pupil plane.

3. The overlay metrology system of claim 1, wherein the common overlap region in the field plane includes +1 diffraction of the collected light from the first Moiré structure and −1 diffraction of the collected light from the second Moiré structure.

4. The overlay metrology system of claim 1, wherein each of the common mutually-coherent beam distributions comprise:
    one of a single illumination beam, two illumination beams in a dipole distribution, or four illumination beams in a quadrupole distribution.

5. The overlay metrology system of claim 1, wherein the one or more detectors comprises:
a two-dimensional sensor.

6. The overlay metrology system of claim 1, wherein the one or more detectors comprises:
two or more one-dimensional sensors.

7. The overlay metrology system of claim 1, wherein the first and second Moiré structures of the particular inverted Moiré structure pair are distributed along a transverse direction orthogonal to the scan direction.

8. The overlay metrology system of claim 7, wherein the one or more inverted Moiré structure pairs comprise:
a first inverted Moiré structure pair having periodicity along a first measurement direction; and
a second inverted Moiré structure pair having periodicity along a second measurement direction different than the first measurement direction, wherein the first and second inverted Moiré structure pairs are distributed along the scan direction.

9. The overlay metrology system of claim 1, wherein the diffractive element comprises:
a diffraction grating.

10. The overlay metrology system of claim 9, wherein the diffraction grating comprises:
an acousto-optic diffraction grating in a Raman-Nath configuration.

11. The overlay metrology system of claim 1, wherein the diffractive element is further located on an optical path associated with the illumination sub-system, wherein the diffractive element generates the mutually-coherent illumination beams.

12. The overlay metrology system of claim 11, wherein the mutually-coherent illumination beams are formed as diffraction orders from an illumination source generated by the diffractive element, wherein the mutually-coherent illumination beams propagate in a forward direction from the diffractive element, wherein the collected light from the first and second Moiré structures are incident on the diffractive element in a return direction opposite the first direction.

13. The overlay metrology system of claim 12, further comprising:
an illumination field stop at an additional field plane configured to selectively pass the diffraction orders from the illumination source forming the mutually-coherent illumination beams propagating along the forward direction and block remaining light, wherein the collected light from the first and second Moiré structures propagates through the illumination field stop along the return direction.

14. The overlay metrology system of claim 1, wherein determining the overlay measurement between the first sample layer and the second sample layer along the particular measurement direction based on the data from the one or more detectors comprises:
determining the overlay measurement based on intensity asymmetries in the second pupil plane based on the data from the one or more detectors.

15. The overlay metrology system of claim 14, wherein determining the overlay measurement based on intensity asymmetries in the second pupil plane based on the data from the one or more detectors comprises:
determining the overlay measurement based on a comparison of relative intensities in the second pupil plane at a particular point in time for locations associated with the +/−1 diffraction orders from the gratings with the first pitch upper gratings and for locations associated with the +/−1 diffraction orders from the gratings with the second pitch.

16. The overlay metrology system of claim 1, further comprising:
one or more beam-scanning optics to scan a position of at least one of the illumination beams while the sample is scanned along the scan direction.

17. The overlay metrology system of claim 16, wherein the one or more beam-scanning optics simultaneously scan the illumination beams in a common pattern during an integration time of the one or detectors for a measurement to mitigate noise.

18. The overlay metrology system of claim 16, wherein the one or more beam-scanning optics scan one of the illumination beams relative to the other in the particular measurement direction while the sample is scanned along the scan direction to induce phase asymmetries between the collected light from the first and second Moiré structures, wherein the one or more detectors generate data at two or more relative positions of the illumination beams, wherein determining the overlay measurement between the first sample layer and the second sample layer along the particular measurement direction based on data from the one or more detectors comprises:
determining the overlay measurement based on the data at the two or more relative positions of the illumination beams.

19. An overlay metrology method comprising:
translating a sample including a Moiré overlay target along a scan direction, wherein the Moiré overlay target includes one or more inverted Moiré structure pairs, wherein a particular one of the one or more inverted Moiré structure pairs includes a first Moiré structure and a second Moiré structure, each including an upper grating on a first layer of the sample and a lower grating on a second layer of the sample that overlaps the upper grating, wherein the upper grating of the first Moiré structure and the lower grating of the second Moiré structure have a first pitch along a particular measurement direction, wherein the lower grating of the first Moiré structure and the upper grating of the second Moiré structure have a second pitch different than the first pitch;
illuminating the first and second Moiré structures of one of the one or more inverted Moiré structure pairs with common mutually coherent illumination beam distributions;
capturing at least +/−1 diffraction orders from the upper and lower gratings of the illuminated one of the one or more inverted Moiré structure pairs as collected light, wherein a first pupil plane includes overlapping pupil-plane distributions of the collected light from the first and second Moiré structures with an interference pattern associated with a relative wavefront tilt between the collected light from the first and second Moiré structures;
diffracting, with a diffractive element located in the first pupil plane, the collected light from the first and second Moiré structures, wherein one diffraction order of the collected light associated with the first Moiré structure and one diffraction order of the collected light associated with the second Moiré structure overlap at a common overlap region in a field plane;
selectively passing light in a common overlap region and blocking remaining light;

detecting at least a portion of a distribution of light at a second pupil plane with one or more detectors, wherein the second pupil plane includes the overlapping pupil-plane distributions of the collected light from the first and second Moiré structures without the interference pattern associated with the relative wavefront tilt between the collected light from the first and second Moiré structures; and determining an overlay measurement between the first sample layer and the second sample layer along the particular measurement direction based on data from the one or more detectors.

20. An overlay metrology system comprising:
an illumination sub-system configured to illuminate an inverted Moiré structure pair on a sample, wherein the inverted Moiré structure pair includes a first Moiré structure and a second Moiré structure, each including an upper grating on a first layer of the sample and a lower grating on a second layer of the sample that overlaps the upper grating, wherein the upper grating of the first Moiré structure and the lower grating of the second Moiré structure have a first pitch along a particular measurement direction, wherein the lower grating of the first Moiré structure and the upper grating of the second Moiré structure have a second pitch along the particular measurement direction different than the first pitch, wherein the illumination sub-system illuminates the first and second Moiré structures with common mutually coherent illumination beam distributions;

an objective lens configured to capture at least +/−1 diffraction orders from the upper and lower gratings of the illuminated one of the one or more inverted Moiré structure pairs as collected light, wherein a first pupil plane includes overlapping pupil-plane distributions of the collected light from the first and second Moiré structures with an interference pattern associated with a relative wavefront tilt between the collected light from the first and second Moiré structures;

a diffractive element located in the first pupil plane, wherein one diffraction order of the collected light associated with the first Moiré structure and one diffraction order of the collected light associated with the second Moiré structure overlap at a common overlap region in a field plane;

a collection field stop located in the field plane configured to pass light in the common overlap region and block remaining light; and one or more detectors configured to capture the one diffraction order of the collected light associated with the first Moiré structure and one diffraction order of the collected light associated with the second Moiré structure passed by the collection field stop.

21. The overlay metrology system of claim 20, wherein the one or more detectors are located in an additional field plane.

22. The overlay metrology system of claim 20, wherein the common overlap region in the field plane includes +1 diffraction of the collected light from the first Moiré structure and −1 diffraction of the collected light from the second Moiré structure.

23. The overlay metrology system of claim 20, further comprising one or more processors configured to determine an overlay measurement based on intensity asymmetries in the second pupil plane based on the data from the one or more detectors, wherein the one or more processors are configured to determine the overlay measurement based on a comparison of relative intensities in the second pupil plane at a particular point in time for locations associated with the +/−1 diffraction orders from the gratings with the first pitch upper gratings and for locations associated with the +/−1 diffraction orders from the gratings with the second pitch.

24. The overlay metrology system of claim 20, wherein each of the common mutually-coherent beam distributions comprise:
one of a single illumination beam, two illumination beams in a dipole distribution, or four illumination beams in a quadrupole distribution.

25. The overlay metrology system of claim 20, wherein the one or more detectors comprises:
a two-dimensional sensor.

26. The overlay metrology system of claim 20, wherein the one or more detectors comprises:
two or more one-dimensional sensors.

27. The overlay metrology system of claim 20, wherein the one or more detectors are located in an additional pupil plane.

28. The overlay metrology system of claim 27, wherein the +1 diffraction orders from the upper gratings and the lower gratings are at least partially non-overlapping in the first pupil plane and the additional pupil plane, wherein the −1 diffraction orders from the upper gratings and the lower gratings are at least partially non-overlapping in the first pupil plane and the second pupil plane.

29. The overlay metrology system of claim 27, further comprising one or more processors configured to determine an overlay measurement between the first sample layer and the second sample layer along the particular measurement direction based on data from the one or more detectors, wherein the one or more processors are configured to determine the overlay measurement based on intensity asymmetries in the additional pupil plane based on the data from the one or more detectors.

30. The overlay metrology system of claim 20, wherein the first and second Moiré structures of the particular inverted Moiré structure pair are distributed along a transverse direction orthogonal to a scan direction.

31. The overlay metrology system of claim 30, wherein the one or more inverted Moiré structure pairs comprise:
a first inverted Moiré structure pair having periodicity along a first measurement direction; and
a second inverted Moiré structure pair having periodicity along a second measurement direction different than the first measurement direction, wherein the first and second inverted Moiré structure pairs are distributed along the scan direction.

32. The overlay metrology system of claim 20, wherein the diffractive element comprises:
a diffraction grating.

33. The overlay metrology system of claim 32, wherein the diffraction grating comprises:
an acousto-optic diffraction grating in a Raman-Nath configuration.

34. The overlay metrology system of claim 20, wherein the diffractive element is further located on an optical path associated with the illumination sub-system, wherein the diffractive element generates the mutually-coherent illumination beams.

35. The overlay metrology system of claim 2, wherein the mutually-coherent illumination beams are formed as diffraction orders from an illumination source generated by the diffractive element, wherein the mutually-coherent illumination beams propagate in a forward direction from the diffractive element, wherein the collected light from the first and second Moiré structures are incident on the diffractive element in a return direction opposite the first direction.

36. The overlay metrology system of claim 35, further comprising:
an illumination field stop at an additional field plane configured to selectively pass the diffraction orders from the illumination source forming the mutually-coherent illumination beams propagating along the forward direction and block remaining light, wherein the collected light from the first and second Moiré structures propagates through the illumination field stop along the return direction.

37. The overlay metrology system of claim 20, further comprising:
one or more beam-scanning optics to scan a position of at least one of the illumination beams while the sample is scanned along a scan direction.

38. The overlay metrology system of claim 37, wherein the one or more beam-scanning optics simultaneously scan the illumination beams in a common pattern during an integration time of the one or detectors for a measurement to mitigate noise.

39. The overlay metrology system of claim 37, wherein the one or more beam-scanning optics scan one of the illumination beams relative to the other in the particular measurement direction while the sample is scanned along the scan direction to induce phase asymmetries between the collected light from the first and second Moiré structures, wherein the one or more detectors generate data at two or more relative positions of the illumination beams.

* * * * *